United States Patent
Yokoyama

(10) Patent No.: US 8,677,855 B2
(45) Date of Patent: Mar. 25, 2014

(54) CONVEYANCE ARM AND CONVEYANCE ROBOT WITH SAME

(75) Inventor: Kouji Yokoyama, Fukuyama (JP)

(73) Assignee: Rorze Corporation, Fukuyama-shi (JP)

( * ) Notice: Subject to any disclaimer, the term of this patent is extended or adjusted under 35 U.S.C. 154(b) by 9 days.

(21) Appl. No.: 13/480,028

(22) Filed: May 24, 2012

(65) Prior Publication Data

US 2012/0240710 A1    Sep. 27, 2012

Related U.S. Application Data

(63) Continuation of application No. PCT/JP2010/070798, filed on Nov. 22, 2010.

(30) Foreign Application Priority Data

Nov. 27, 2009    (JP) .................................. 2009-270092

(51) Int. Cl.
    *B25J 18/00*    (2006.01)

(52) U.S. Cl.
    USPC .................. 74/490.01; 74/490.05; 901/23

(58) Field of Classification Search
    USPC ............ 74/490.01, 490.02, 490.03, 490.04, 74/490.05, 490.06; 901/23, 27, 28, 50
    See application file for complete search history.

(56) References Cited

U.S. PATENT DOCUMENTS

| | | | | |
|---|---|---|---|---|
| 5,099,400 | A * | 3/1992 | Lee | 362/37 |
| 5,609,408 | A * | 3/1997 | Targetti | 362/523 |
| 5,971,574 | A * | 10/1999 | Taniuchi et al. | 362/508 |
| 6,247,835 | B1 * | 6/2001 | Taniuchi | 362/524 |
| 7,703,954 | B2 * | 4/2010 | Kusagaya | 362/465 |
| 8,469,566 | B2 * | 6/2013 | Chen | 362/523 |
| 2001/0004852 | A1 | 6/2001 | Mitsuyoshi | |
| 2001/0012483 | A1 | 8/2001 | Kono et al. | |
| 2002/0122310 | A1 * | 9/2002 | DiPenti et al. | 362/512 |
| 2003/0174508 | A1 * | 9/2003 | Ruckwied | 362/512 |

FOREIGN PATENT DOCUMENTS

| | | |
|---|---|---|
| JP | H04-030447 A | 2/1992 |
| JP | 2002-066966 A | 3/2002 |
| JP | 2002-362738 A | 12/2002 |
| JP | 2003-094376 A | 4/2003 |
| JP | 2003-209155 A | 7/2003 |
| JP | 2008-188719 A | 8/2008 |
| JP | 2008-284629 A | 11/2008 |
| JP | 2009-136952 A | 6/2009 |

* cited by examiner

*Primary Examiner* — David M Fenstermacher
(74) *Attorney, Agent, or Firm* — Manabu Kanesaka

(57) ABSTRACT

First and second parallel link mechanisms 36, 38 are connected via a short link 35 arranged on a rotational angle transmission mechanism 29 so that a rotation applied to the first parallel link mechanism 36 is transmitted to the second parallel link mechanism 38 via the rotational angle transmission mechanism 29. The rotational angle transmission mechanism 29, the second parallel link mechanism 38 and the driven side link of the first parallel link mechanism 36 are horizontally supported by the drive side link 30 of the first parallel link mechanism 36. The rotational angle transmission mechanism 29 transmits the rotational angle applied to the drive side link 30 of the first parallel link mechanism 36 to the drive side link 32 of the second parallel link mechanism 38 supported by the drive side link 30 via the guide means that is parallel to the short link 35.

4 Claims, 14 Drawing Sheets

CONVEYANCE ARM AND CONVEYANCE ROBOT WITH SAME

RELATED APPLICATIONS

The present application is Continuation of National Phase of International Application No. PCT/JP2010/070798 filed Nov. 22,2010, and claims priority from Japanese Application No. 2009-270092, filed Nov. 27, 2009.

TECHNICAL FIELD

The present invention relates to a conveyance robot mounted in an EFEM (Equipment Front End Module) or various manufacturing devices of electronic components such as LCD and semiconductors, the conveyance robot being used for conveying a work such as a semiconductor wafer or LCD substrate to a desired position, taking in or out the work.

BACKGROUND ART

Typically, as an electronic component, such as an LCD substrate or semiconductor wafer, is subjected to ultrafine surface processing, a transfer chamber 1 and processing chambers 2 of a manufacturing device for the electronic component are maintained in a vacuum, reduced-pressure or inert gas atmosphere in order to prevent undesirable chemical reaction or dust pollution on the surface of the electronic component.

As illustrated in one example of FIG. 1, in this manufacturing device, an opening 3 is provided approximately at the center of a bottom wall of the transfer chamber 1, for mounting the conveyance robot configured to take in or out a work between processing chambers, and a special conveyance robot is mounted on this opening 3 via a flange or the like in an air tight manner. Around the transfer chamber 1, the processing chambers 2 for performing various processing on the work and load lock chambers 4 for taking in or out the work from or to outside the device are arranged in a such a manner that they are communicable to each other via gates 5 as port openings. The transfer chamber 1 and these processing chambers 2 and load lock chambers 4 can be opened and closed while they are kept in an air tight state by an opening door operated by a valve, and various gas atmospheres in the processing chambers 2 and vacuum or reduced pressure atmosphere can be isolated from each other. And, in such a manufacturing device, the shape of the transfer chamber 1 is often hexagonal or octagonal, and the processing chambers and the load lock chambers 4 are arranged in a radial manner from the conveyance robot at the center. In this way, as the processing chambers 2 and the load lock chambers 4 are arranged radially, the conveyance robot is able to move the work from a load lock chamber to various processing chambers linearly.

As such a conventional robot as used in the transfer chamber 1, there is widely known a conveyance robot disclosed in Japanese Patent. Application Laid-Open 4-30447. This conveyance robot performs conveyance of the work by combining plural parallel link mechanisms, operating the link mechanisms together by a rotational force applied from the drive sources to drive side links, and moving a conveyance table on which the work is placed, back and forth between the transfer chamber and the processing chambers.

FIG. 2A is a plan view schematically illustrating a link mechanism provided in the conventional conveyance robot, FIG. 2B is a lateral view schematically illustrating one example of the conventional conveyance robot and FIG. 2C is a lateral view illustrating worn bearing and gear of the conveyance robot illustrated in FIG. 2B. The conventional conveyance robot has a conveyance arm 8 composed of a first parallel link mechanism 6 and a second parallel link mechanism 7 connected to each other and those mechanisms 6, 7 have drive side links and driven side links arranged parallel to each other. A conveyance table 9 for holding a work is provided at the tip end of the second parallel link mechanism 7. The first parallel link mechanism 6 and the second parallel link mechanism 7 are placed vertically shifted from each other in order to prevent interference from each other. The first parallel link mechanism 6 has a pair of long links 10, 11 supported by the base table 12 rotatable and a drive axis 13 as a rotational center of the drive side link 10 is connected to a drive motor (not shown) mounted under the base table 12. At the tip ends of the links 10, 11, a pair of links 14, 15 of the second parallel link mechanism 7 is connected rotatable thereto and the conveyance table 9 is connected to the tip ends of these paired links 14, 15 rotatably.

At a common short link 18a as a joint part of the links 10, 11 and the links 14, 15 of the first parallel link mechanism 6 and the second parallel link mechanism 7, gears 16, 17 are provided engaging each other with a gear ratio of 1:1. The gear 16 is fixed to the link 10 as the drive side link of the first parallel link mechanism 6 and the gear 17 is connected to the link 15 that is one of the links of the second parallel link mechanism 7 and connected to the link 11 as the driven side link of the first parallel link mechanism 6. The base ends of the links 14, 15 of this second parallel link mechanism 7 extend beyond the respective gears 16, 17 and are connected by the short link 18b rotatably.

In this configured conventional, conveyance robot, the drive axis 13 is rotated by the drive motor (not shown) thereby to rotate the link 10 as the drive side link of the first parallel link mechanism 6 and in conjunction with this rotation, the first parallel link mechanism 6 rotates by the same rotational angle as that applied to the link 10. This rotational angle of the first parallel link mechanism 6 is transmitted to the link 15 as the drive side link of the second parallel link mechanism 7 via gears 16, 17 that engages with same gear ratios, and the link 15 rotates by the same rotational angle in the direction opposite to the rotational direction applied to the link 10. In conjunction with this rotation of the link 15, the second parallel link mechanism 7 rotates by the same rotational angle as that transmitted to the link 15.

PATENT LITERATURE

PL1: Japanese Patent Application Laid-Open No. H04 (1992)-30447

SUMMARY OF INVENTION

Technical Problem

In the above-described conventional conveyance robot, a drive force in the rotational direction applied to the link 10 from the drive motor via the drive shaft 13 is transmitted from the link 10 to the link 15 via the gears 16, 17 as a common short link so that the first parallel link mechanism 6 and the second parallel link mechanism 7 operate together to move the conveyance table 9 back and forth. As the link 10 serves to transmit the drive force to both link mechanisms 6, 7 and support weights of the gear 16 and the link 14, the heaviest load is applied to the link 10. In addition, as the link 15 serves to support a weight of the conveyance table 9 and transmit the drive force transmitted from the link 10 via the gears 16, 17 to whole of the second parallel link mechanism 7, the link 15 needs to bear a heavy load and use a member of large cross sectional area, which causes an increase of the weight of the link 15.

If the link 11 only serves to control the attitude of the first parallel link mechanism 6 following rotation of the link 10, it can be composed of a member of smaller cross sectional area than the link 10. However, as described above, it needs to support the weights of the gear 17 and the link 15 which work as the drive side link of the second parallel link mechanism 7, the link 11 is required to have a larger cross sectional area and increased strength. In consideration of this, as the link 14 serves to support the conveyance table 9 with the link 15 and control the attitude of the second parallel link mechanism 7 following the operation of the link 15, only the link 14 can bear a relatively smaller load and use a member of smaller cross sectional area, while the other links need to have larger cross sectional areas and increased strength as they bear heavy loads, which imposes a heavy burden in terms of material cost.

Besides, the rotational angle applied to the link 10 is transmitted to the link 15 supported rotatable by the link 11 in parallel to the link 10 via the gears 16, 17. Here, as rotatable ends of the links 10, 11, 14, 15 are mounted via bearings for smooth movement of the links, the drive force needs to be transmitted to the conveyance table 9 via many bearings 19 (see FIG. 3). Typically, after each bearing 19 is used for a long period of time, contact surfaces are worn and the bearing 19 rattles. Therefore, although tip ends of the links 10, 11, 14, 15 are first supported in a horizontal manner when assembling, they may droop due to the bearing 19 rattling after use for a long period of time (see FIG. 2C), which finally causes conveyance trouble and makes it impossible to convey the work up to a designated height, and causes damages to the work in the worst case.

The present invention was carried out in view of the foregoing, and aims to provide a conveyance arm and a conveyance robot with the conveyance arm such that a parallel link mechanism of which a driven side link has a smaller cross section, and in a support part of a heavy load, the parts which are highly likely to wear after being used under of for a long period of time such as a gears or small-diameter bearing 19 are minimized in their number as possible. As the result, the cost of the conveyance arm is low and the high conveyance accuracy can be maintained even after being operated for a long period of time.

Solution to Problem

In order to attain the above-mentioned objective, the present invention provides a conveyance arm comprising: a first parallel link mechanism having a first drive side link with an end connected to a drive axis and first driven side link arranged in parallel to the first drive side link; a second parallel link mechanism having a second drive side link with an end connected to an opposite end of the first drive side link via a rotational axis rotatably and a second driven side link with an end connected to an opposite end of the first driven side link via a rotational axis rotatably, the second driven side link being arranged in parallel to the second drive side link; a short link connecting ends of the links of the first parallel link mechanism and the second parallel link mechanism rotatably; and a rotational angle transmission mechanism having a linear conversion link mechanism for converting rotation applied to the first drive side link into linear movement along the short link and a rotation conversion link mechanism for converting the linear movement into rotation to rotate the second drive side link in an opposite direction by an angle equal to a rotational angle of the first drive side link, wherein rotation applied to the first drive side link of the first parallel link mechanism causes an opposite end of the second parallel link mechanism to move back and forth.

Further, the conveyance arm is characterized in that the rotational angle transmission mechanism has a first link rod with an end mounted on a predetermined position of the first drive side link rotatably, a second link rod with an end mounted rotatably on a position extended in a direction of a tip end of the second drive side link of the second parallel link mechanism in a horizontal plane, and a guide means to which opposite ends of the first and second link rods are mounted rotatably, the guide means for guiding the opposite ends of the first and second link rods in a linear direction, the positions on which the first and the second link rods are mounted are symmetrical with respect to the short link in common, and rotation applied to the first drive side link of the first parallel link mechanism causes the one end of the second link rod to follow a circular track which is symmetrical with a circular track drawn by the one end of the first link rod with respect to the short link.

Furthermore, the conveyance arm is characterized in that the rotational angle transmission mechanism is rotatably held at a tip end of the first drive side link, and a tip end of the first driven side link of the first parallel link mechanism and a base end of the second driven side link of the second parallel link mechanism are mounted rotatably on a joint axis arranged on an upper surface of the rotational angle transmission mechanism, concentrically and vertically shifted from each other.

In the above-described conveyance arm, the weights of the driven side link of the first parallel link mechanism, the rotational angle transmission mechanism and the second parallel link mechanism are horizontally supported by the drive side link of the first parallel link mechanism and therefore, such load is not applied to the driven side links of the first and second parallel link mechanisms.

Furthermore, provided is a conveyance robot equipped with the conveyance arm that has the above-mentioned features. Still furthermore, in addition to this conveyance robot, provided is a work conveyance robot comprising: first and second conveyance arms, wherein; each of the first and the second conveyance arms consists of the conveyance arm of claim 1, each of the first drive side links of the first and the second conveyance arms has a circular ring part and an arm part extending radially from the circular ring part, the circular ring parts of the first and the second conveyance arms are concentrically and vertically shifted each other and are independently rotatable, a first rotational angle transmission mechanism as the rotational angle transmission mechanism of the first conveyance arm is supported pivotably to a tip end of the first drive side link of the first conveyance arm, a second rotational angle transmission mechanism as the rotational angle transmission mechanism of the second conveyance arm is supported pivotably to a tip end of the first drive side link of the second conveyance arm, the first driven side link of the first conveyance arm is arranged in parallel to a straight line connecting a rotational center of the circular ring parts to a rotational center of the first rotational angle transmission mechanism while the first driven side link of the second conveyance arm is arranged in parallel to a straight line connecting the rotational center of the circular ring parts to a rotational center of the second rotational angle transmission mechanism, a base end of the first driven side link of either one of the first and second conveyance arms is supported pivotably to the circular ring part of the other conveyance arm that has the first driven side link with a base end pivotally supported on a top pinto, and the top plate is rotated concentrically with the circular ring parts by a third drive source other than drive sources for rotating the circular ring parts of the first and the second conveyance arms.

Advantageous Effects of Invention

According to the above-described invention, it is possible to provide relatively low-cost conveyance arm and conveyance robot. Further, it is possible to reduce the cross sectional area of the driven side link of the parallel link mechanism and to use a large-diameter bearing in the drive side link. Furthermore, it is possible to minimize use of parts that are likely to wear after being used under load for a long period of time, such as a small-diameter bearing 19, and thereby to maintain high conveyance accuracy while preventing rattling in the vertical direction even after being operated for a long period of time.

DESCRIPTION OF EMBODIMENTS

Figure 4A:
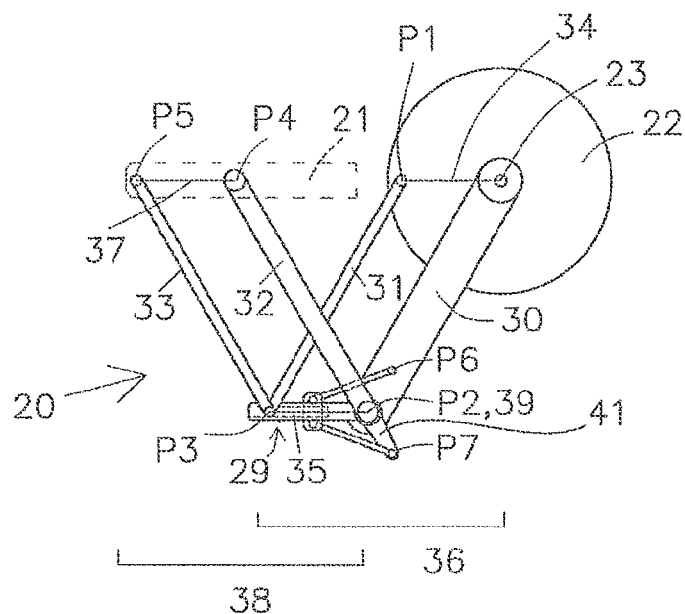
FIG. 4A is a plan view illustrating an example of a conveyance robot according to a first embodiment of the present invention, in which a conveyance finger is at the standby position.
Figure 4B:
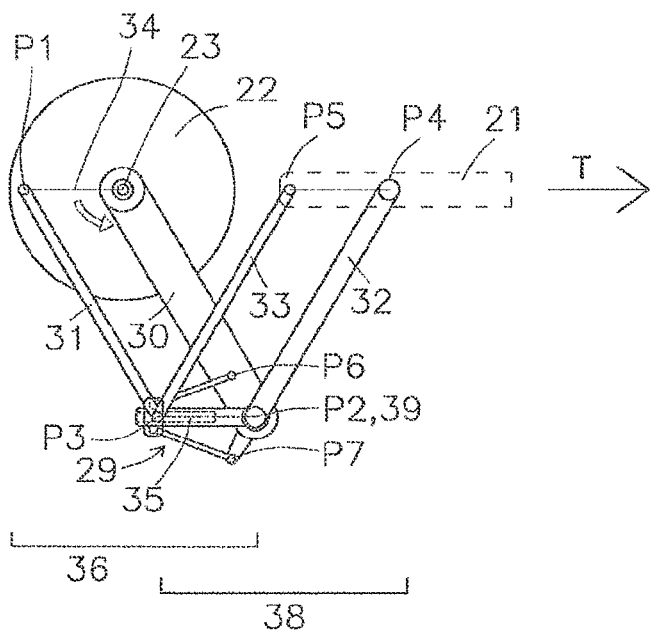
FIG. 4B is a plan view illustrating the state of parallel link mechanisms and the rotational position of each arm when the conveyance finger of the conveyance device shown in FIG. 4A is at the forward position.
Figure 5A:
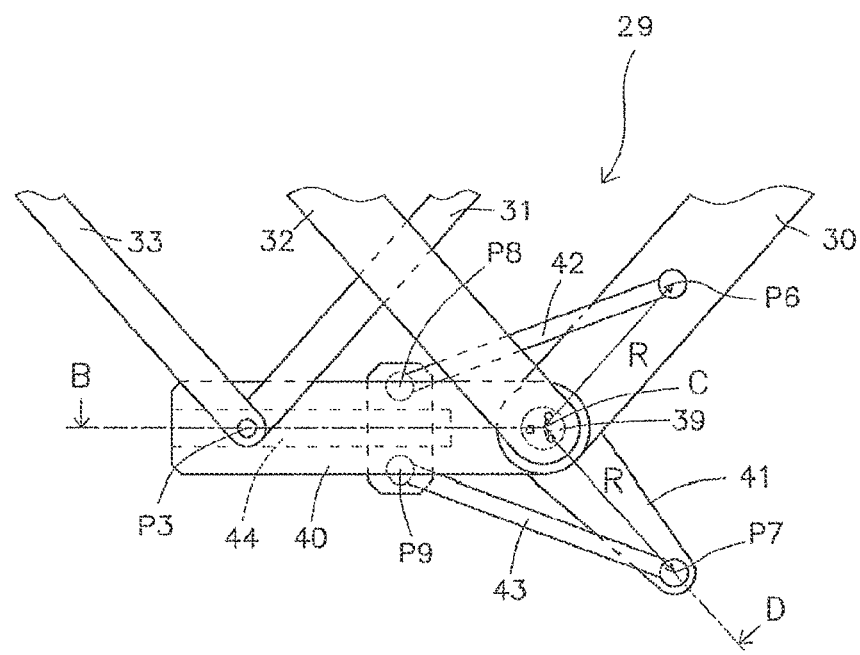
FIG. 5A is a partially enlarged plan view illustrating a rotational angle transmission mechanism of the first conveyance robot of the present invention.
Figure 5B:
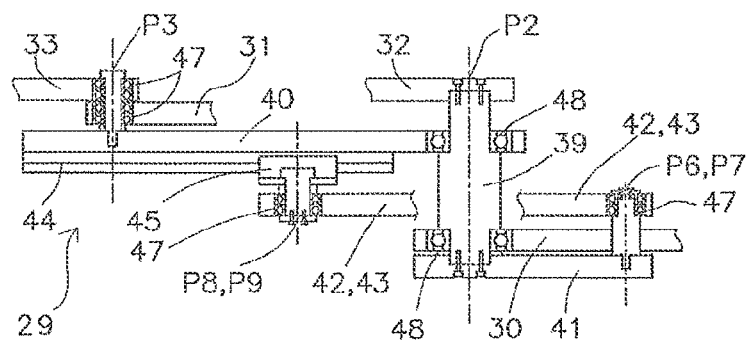
FIG. 5B is a cross sectional view of the rotational angle transmission mechanism taken along the cross sectional line of B-C-D of FIG. 5A.

With reference to the drawings, one embodiment of the present invention will be described in detail below. FIGS. 4A and 4B are plan views each illustrating parallel link mechanisms of a conveyance arm 20 provided in a conveyance robot (hereinafter referred to as "first conveyance robot") according to one embodiment of the present invention. In the plan view of FIG. 4A, a conveyance finger 21 is located at a standby position and in the plan view of FIG. 4B, the parallel link mechanisms and the rotational position of the arm when the conveyance finger 21 is located at a forward position are shown. FIG. 5A is a partially-enlarged plan view illustrating a rotational angle transmission mechanism 29 and FIG. 5B is a cross sectional view of the rotational angle transmission mechanism 29 taken along the cross-sectional line of B-C-D illustrated in FIG. 5A.

Driving means of the first conveyance robot includes a drive source (not shown) configured to transfer a rotational force to a drive axis 23 that is arranged on a lower surface of a base plate 22 so as to pass through a through hole formed in the base plate 22 and protrude upwardly and vertically, a turning drive source (not shown) configured to turn the base plate 22 around the rotational center axis of the drive axis 23 in a horizontal plane, and a lifting drive source (not shown) configured to lift up and down the first conveyance robot.

The conveyance arm 20 has a pair of links 30, 31 that are parallel to each other and equal in length, a rotational angle transmission mechanism 29, a pair of links 32, 33 that are parallel to each other and equal in length, and a conveyance finger 21 for holding a work. Base ends of the links 30, 31 are mounted rotatable on the base plate 22 as a base. And base ends of the links 32, 33 are mounted rotatable on the rotational angle transmission mechanism 29. The base end of the link 30 (first drive side link) is fixed to the drive axis 23 and the base end of the link 31 (first driven side link) is fixed to the joint axis P1 provided on the base plate 22 to be rotatable via a ball bearing 47 as a bearing member. Besides, at a tip end of the link 30, a rotary shaft 39 as the joint axis P2 is supported pivotably via a ball bearing 48 (see FIG. 5B). To this rotary shaft 39, the rotational angle transmission mechanism 29 is supported pivotably via the ball bearing 48. The tip end of the link 31 is pivotably mounted on the joint axis P3 provided on the rotational angle transmission mechanism 29 via the ball bearing 47. The short link axis 34 connecting the drive axis 23 to the joint axis P1 and the short link axis 35 composed of the joint axis P3 arranged at the tip end of the link 31 and the joint axis P2 arranged at the tip end of the link 30 are parallel to each other and equal in length to each other.

With this structure, the rotational force given to the link 30 as a drive side link of the first parallel link mechanism 36 via, the drive axis 23 is transferred to the link 31 via the short link axis 35, and the links 30, 31 rotate around the rotational center axis of the joint axis P1 and of the drive axis 23 respectively by the same angles. At this time, the short link axis 35 connected by the joint axes P2, P3 moves back and force in conjunction with rotation of the links 30, 31 while it is kept in parallel to the short link axis 34 connected to the drive axis 23 and the joint axis P1. These links 30, 31 and short link axes 34, 35 form the first parallel link mechanism 36, which serves as a drive side link mechanism of the conveyance arm 20 and a mechanism to vertically support the second parallel link mechanism which is described later.

Next description is made about the first parallel link mechanism 36 and the second parallel link mechanism 38 connected thereto. Both link mechanisms 36 and 38 use the same short link axis 35. The base end of the link 32 (second drive side link) is fixed unrotatable to the joint axis P2 (rotary shaft 39) provided in the rotational angle transmission mechanism 29 (see FIG. 5B). The base end of the link 33 (second driven side link) is mounted rotatable via the ball bearing 47 onto the joint axis P3 to which the tip end of the link 31 is mounted rotatable, while the position is changed vertically and concentrically relative to the tip end of the link 31. Besides, the tip end of the link 32 is mounted rotatable via the ball bearing onto the joint axis P4 (see FIGS. 4A and 4B) provided at a lower part of the conveyance finger 21 and the tip end of the link 33 is mounted rotatable via a ball bearing onto the joint axis P5 provided at a lower part of a conveyance finger 21, likewise. These joint axes P4, P5 are connected to each other by a short link axis 37, which is arranged in a position parallel to the short link axis 35. The short link axes 35, 37 are equal in length to each other.

With this structure, when the rotational force with the joint axis P2 of the base end as a center is applied from the outside to the link 32 that is the drive side link of the second parallel link mechanism 38, the link 33 also rotates by the same angle in conjunction with rotation of the link 32 and the short link axis 37 connected to both tip ends of the links 32, 33 moves back and forth while it is kept in parallel to the short link axis 35.

Here, as the link 30 supports the second parallel link mechanism 38 and the rotational angle transmission mechanism 29 (including weights of the conveyance finger and work) against the gravity and transmits a drive force in the rotational direction transmitted from the drive axis 23 to each link mechanism, the link 30 has the greatest cross sectional area among the four links 30, 31, 32, 33. The link having the second greatest cross sectional area is the link 32, because the link 32 transmits the drive force transmitted from the link 30 to the second parallel link mechanism 38 and supports the conveyance finger 21. As the links 31, 33 mainly serve to control the attitude of each parallel link mechanism and do not need to support a heavy load, their cross sectional areas can be smaller than those of the links 30, 32. Besides, the member used in each link here is of stainless material as it is used in the vacuum or reduced pressure atmosphere, however, it may be modified appropriately to titanium material e.g., or hollow pipe material or honeycomb structure thereby to achieve weight reduction in accordance with the load to support.

Next description is made, with reference to FIGS. 5A and 5B, about the rotational angle transmission mechanism 29 that transmits rotation of the link (first drive side link) 30 as the drive side link of the first parallel link mechanism 36 to the link (second drive side link) 32 as the drive side link of the second parallel link mechanism 38. The rotary shaft 39 as the joint axis P2 is pivotably supported by the tip end of the link 30 via the ball bearing 48 and the base end of the link 32 is fixed to the top of the rotary shaft 39 with a bolt. The rotary shaft 39 has a function of the joint axis P2 and takes a column shape. Here, the diameter of the rotary shaft 39 is smeller at the upper part that supports the link base 40 as the short link axis 35 and at the lower part that engages the tip end of the link 30 than at the other part so as to achieve positioning in a vertical direction and prevent dropping. The link base 40 as a base of the rotational angle transmission mechanism 29 is supported pivotably to the rotary shaft 39 via the ball bearing 48. At the upper side of this link base 40, the joint axis P3 is arranged for mounting the tip ends of the links 31 and 33 thereon. Besides, at the lower part of the link base 40, the slide guide 44 as guiding means for guiding the joint axes P8, P9 in the lateral direction in FIG. 5B is mounted in parallel to the short link axis 34. Further, at the bottom of the rotary shaft 39, the base end of the link lever 41 is fixed thereto with a bolt. With this structure, the link lever 41 and the link 32 rotate together with the rotary shaft 39 as the rotational axis. Here, in this embodiment, the link 32 and the link lever 41 are separate members, however, the base end of the link 32 may be elongated to be used as the link lever 41.

At the position a distance R away from the rotational center axis of the joint axis P2 (rotary shaft 39) on the link 30, the joint axis P6 is provided and likewise, at the position a distance R away from the rotational center axis of the joint axis P2 (rotary shaft 39) on the link lever 41, the joint axis P7 is provided. That is, the joint axes P6 and P7 are arranged on the circle of a radius R with the joint axis O2 (rotary shaft 39) as the rotational center axis. On this joint axis P6, one end of the first link rod 42 is mounted rotatably via the ball bearing 47, and on the joint axis P7, one end of the second link rod 43 having the same length as the first link rod 42 is mounted rotatable via the ball bearing 47. The other ends of the second link rod 43 and the first link rod 42 are mounted rotatable on the joint axis P9 and the joint axis P8, respectively, mounted on the slider 45 to be slidable along the slide guide 44 as linear guide means. Further, the joint axes P6, P7 and the joint axes P8, P9 are arranged symmetrical relative to the symmetrical line B-C (see FIG. 5A) connecting the center of the joint axis P2 to the center of the joint axis P3.

Figure 6A:
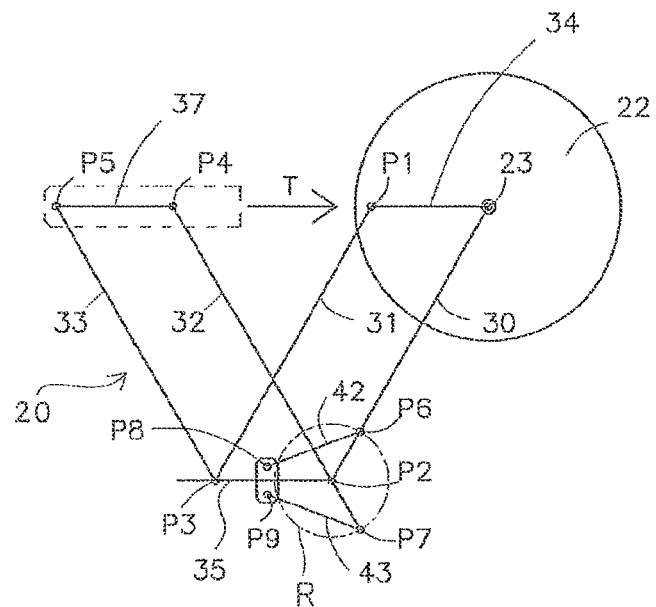
FIG. 6A is a plan view schematically illustrating the position of each joint axis and link when the conveyance arm of the first conveyance robot of the present invention is at the standby position.
Figure 6B:
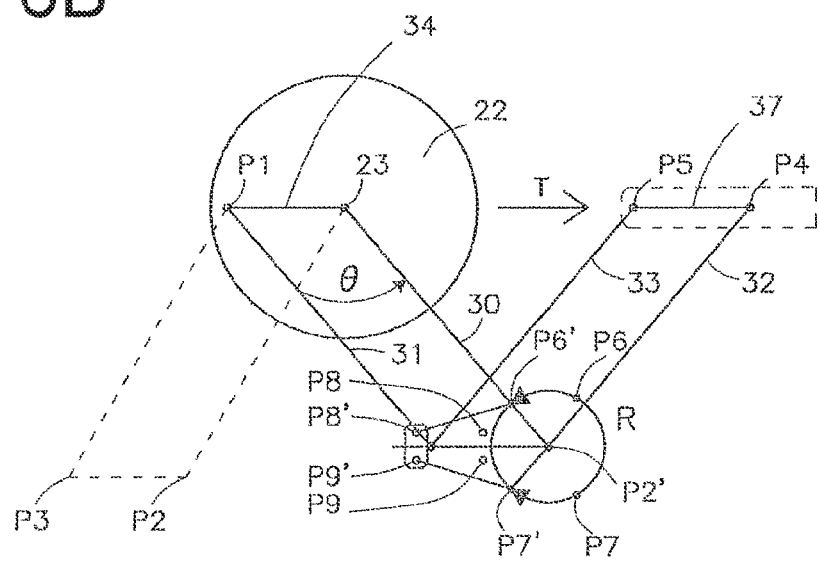
FIG. 6B is a plan view schematically illustrating the conveyance arm of the first conveyance robot of the present invention moving forward.

The following description is made about the operation of each member of the rotational angle transmission mechanism 29 when the rotational movement is applied from the drive axis 23 to the link 30. FIG. 6A is a plan view schematically illustrating the positions of each join axis and each link when the conveyance arm 20 is at the standby position. FIG. 6B is a plan view schematically illustrating the conveyance arm 20 moving forward. When the drive source (not shown) is at the original position, the conveyance arm 20 is at the standby position shown in FIG. 6A. When a rotational force by the angle θ in the counterclockwise direction in FIG. 6A is applied from the drive source to the link 30 via the drive axis 23, the link 30 rotates by the angle θ around the center axis of the drive axis 23.

Then, the link 31 that shares the short link axes 34, 35 with the link 30 and is arranged in parallel to the link 30 also rotates in the counterclockwise direction by the angle θ around the center axis of the joint axis P1 in conjunction with the link 30. With this motion, the link base 40 (rotational angle transmission mechanism 29) to which the tip ends of both links 30, 31 are connected rotatable starts to move in the moving direction T while it is kept in parallel to the short link axis 34. While the link 30 rotates, the joint axis P6 arranged on the link 30 also rotate by the angle θ in the counterclockwise direction about the center axis of the joint axis P2 and the joint axis P6 at the standby position moves following the arc of a radius R to the position P6' on the circle of a radius R on the rotational angle transmission mechanism 29. In conjunction with this movement, of the joint axis P6, the first link rod 42 moves the joint axis P8 provided on the slider 45 along the slide guide 44 to the position. P8' That is, the first link rod 42 converts a circular moving distance of a radius R traced by the joint axis P6 to a linear moving distance of the joint axis P8.

With this operation, the joint axis P9 provided on the slider 45 like the joint axis P8 is also moved to the position P9' together with the slide guide 44. As the joint axis P8 and the joint axis P9 are symmetrical with respect to the symmetrical line B-C (FIG. 5A), the moved joint axis P8' and the moved joint axis P9' are also symmetrical with respect to the symmetrical line B-C. With this movement, the second link rod 43 with an end fixed rotatable to the joint axis P9 moves the joint axis P7 in the clockwise direction to the position P7' along the arc which is axisymmetrical to the arc drawn by the joint axis P6. In other words, as the joint axes P6, P8 as well as the first link rod 42 and the joint axes P7, P9 as well as the second link rod 43 are symmetric with respect to the symmetrical line B-C, when the joint axis P6 moves around the center axis of the joint axis P2 by the angle θ in the counterclockwise direction, the joint axis P7 moves round the center axis of the joint axis P2 by the angle θ in the clockwise direction (see FIG. 6B). With this rotation, the link lever 41 provided with the joint axis P7 also rotates around the center axis of the joint axis P2 (rotary shaft 39) by the angle θ in the clockwise direction and likewise, the link 32 with an end fixed to the joint axis P2 (rotary shaft 39) rotates around the center axis of the joint axis P2 (rotary shaft 39) by the angle θ in the clockwise direction.

Here, the link 33 arranged in parallel to the link 32 also rotates around the center axis of the joint axis P3 by the angle θ in the clockwise direction and the conveyance finger 21 of which both arm ends are fixed rotatable moves in the moving direction while the short link axis 37 of the second parallel link mechanism 38 is kept in parallel to the short link axis 35. The links 30, 31 of the first parallel, link mechanism 36 and the links 32, 33 of the second parallel link mechanism 38 are equal in length between joint axes to each other, and the first parallel link mechanism 36 and the second parallel link mechanism 38 share the short link axis 35. With this structure, the short link axis 37 of the second parallel link mechanism 38 can move linearly in the direction T on the extension of the line connecting the center axis of the drive axis 23 to the center axis of the joint axis P1 by rotation applied to the base end of the link 30 via the drive axis 23. Here, in the above-described embodiment, the joint axis P6 is placed on the link 30 and the joint axis P7 is placed on the extension of the base end of the link 32. The present invention is not limited to this arrangement, the joint axis P6 may be placed on the extension of the tip end of the link 32 and the joint axis P7 may be arranged on the link 32. That is, the joint axes P6, P7 may be arranged at the symmetric positions with respect to the short link axis 35 in the plan view.

Figure 7A:
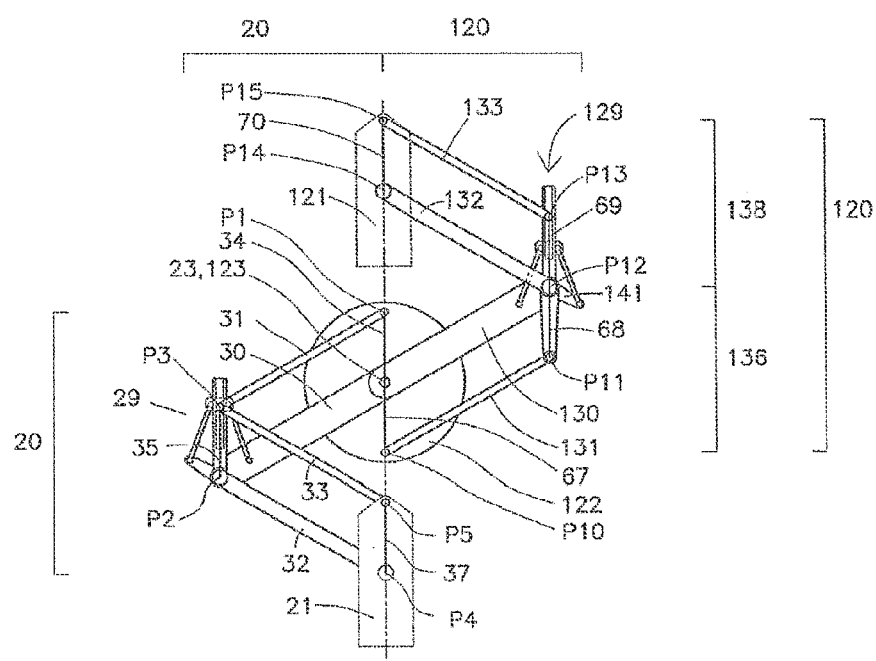
FIG. 7A is a plan view of a conveyance robot according to a second embodiment of the present invention (second conveyance robot)
Figure 7B:
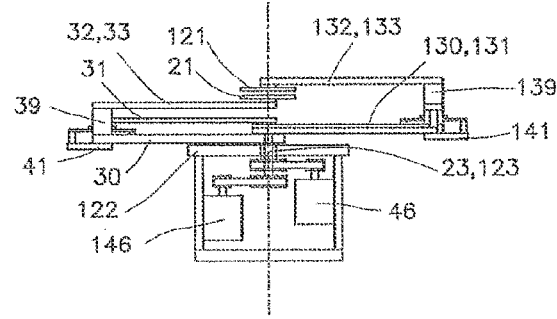
FIG. 7B is a front cross sectional view of the second conveyance robot.
Figure 8A:
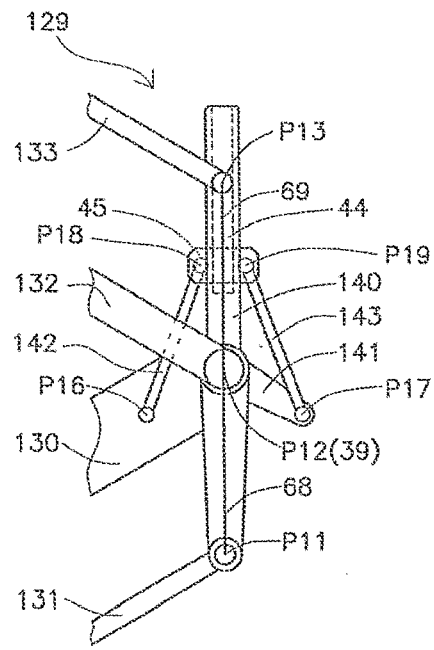
FIG. 8A is a partially enlarged plan view illustrating rotational angle transmission mechanism used in the second conveyance robot.
Figure 8B:
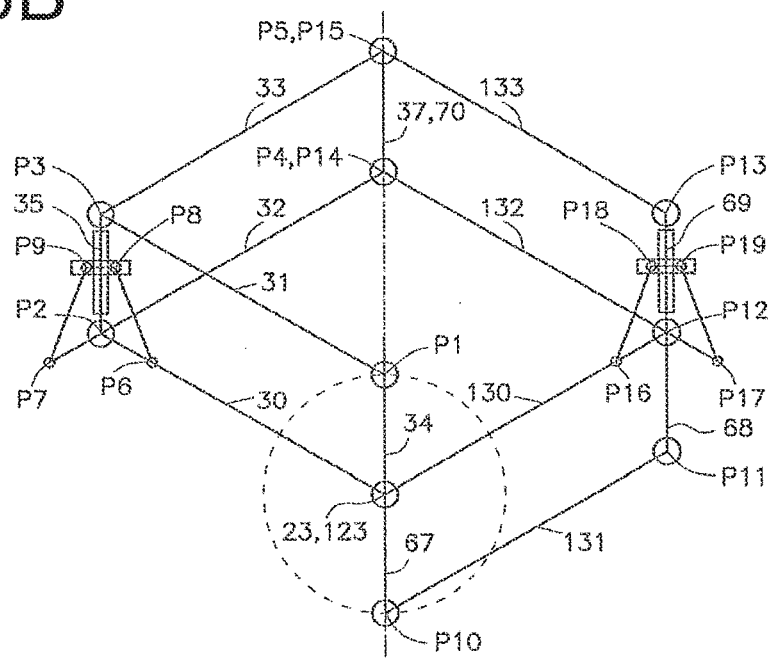
FIG. 8B is a view schematically illustrating the position of each link and each joint axis when the second conveyance robot is at the standby (original) position.

In the above-described embodiment, the first conveyance robot has only one conveyance finger 21 that can be operated by combination of parallel, link mechanisms. Next description is made in detail, with reference to FIGS. 7A, 7B, 8A and 8B, about a conveyance robot according to a second embodiment (hereinafter referred to as "second conveyance robot") that has two conveyance fingers 21 operable independently. FIG. 7A is a plan view of the conveyance robot (second conveyance robot) according to the second embodiment of the present invention and FIG. 7B is a front cross sectional view of the second conveyance robot. FIG. 8A is a partial enlarged plan view illustrating details of a rotational angle transmission mechanism 129 provided in the second conveyance robot and FIG. 8B is a view schematically illustrating positions of each link and each joint axis when the second conveyance robot is at the standby (original) position in FIG. 7A, the operations described with reference to FIGS. 6A and 6B are performed to move the conveyance finger 21 provided at the tip end of one conveyance arm 20 in the moving direction T and the conveyance finger 121 provided at the tip end of the other conveyance arm 120 is at the standby position (original position). As the conveyance arm 20 for moving the conveyance finger 21 back and forth has the same structure and positional relation as that of the first conveyance robot described in the above-described embodiment, the same reference numerals are added in illustration. The conveyance arm 120 newly added to move the conveyance finger 121 back and forth has a first parallel link mechanism 136, a second parallel link mechanism 138 and a rotational angle transmission mechanism 129 that transmits rotation of the first parallel link mechanism 136 to the second parallel link mechanism 138. Here, arrangement of each link arm of the conveyance arm 120 and the rotational angle transmission mechanism 129 are different from those provided in the first conveyance robot in the above-described embodiment.

Like the conveyance arm 20, also in the conveyance arm 120, the link 130 as the drive side link of the first parallel link mechanism 136 serves to support the rotational angle transmission mechanism 129 and the second parallel link mechanism 138 in the vertical direction and transmit a drive force in the rotational direction transmitted from the drive axis 123 to each link mechanism, and therefore, the link 130 has the greatest cross sectional area among the four links 130, 131, 132, 133. The link having the second greatest cross sectional area is the link 132 because it serves to transmit the drive force transmitted from the link 130 to the second parallel link mechanism 138 and to support the conveyance finger 121 in the vertical direction. The links 131, 133 mainly serve to control the attitude of each parallel link mechanism and do not need to support a heavy load, and therefore, they can have smaller cross sectional areas.

In the rotational angle transmission mechanism 29 provided in the conveyance arm 20, the tip end of the link 31 as the driven side link of the first parallel link mechanism 36 and the base end of the link 33 as the driven side link of the second parallel link mechanism 38 are arranged on the rotational center axis of the joint axis P3 at different heights. However, in the rotational angle transmission mechanism 129 provided in the conveyance arm 120, the joint axis P11 on which the tip end of the link 131 as the driven side link of the first parallel link mechanism 136 is mounted rotatable and the joint axis P13 on which the base end of the link 133 as the driven side link of the second parallel link mechanism 138 is mounted rotatable are arranged at positions 180-degree separated from each other on the same circle with the center axis of the joint axis P12 at the tip end of the link 130 as a center. In other words, the rotational center axes of the joint axes P11, P12, P13 are arranged on the same straight line in parallel to the moving direction T. As such, in the conveyance arm 120, the short link axis 68 arranged at the tip end of the first parallel link mechanism 136 and the short link axis 69 arranged at the base end of the second parallel link mechanism 138 have the common joint axis of the joint axis P12 and are arranged in parallel to the moving direction T of the conveyance fingers 21, 121.

With such arrangement, as compared with the structure in which the tip end of the link 31 and the tip end of the link 33 are arranged on the rotational, center axis of the joint axis P3 at different heights on the upper part of the rotational angle transmission mechanism 29, the entire height of the conveyance arm 120 can be reduced and the spacer for shoring up the position in the height direction can be omitted. Besides, it is also possible to take in and out works at a lower position, thereby reducing the height of the inner part of the transfer chamber 1. Besides, if there is sufficient space in the height direction, the conveyance arm 120 can be arranged in such a manner that the conveyance arms 20 and 120, shown in the plan view, are symmetric to each other.

Next description is made about the structure of the conveyance arm 120 provided with the rotational angle transmission mechanism 129. Here, as the conveyance arm 20 is already described with reference to the above-described first conveyance robot, explanation is omitted here. The conveyance arm 120 has a pair of links 130, 131 that have base ends mounted rotatable on the base plate 122 and are arranged in parallel to each other, the rotational angle transmission mechanism 129, a pair of links 132, 133 that have base ends mounted rotatable on the rotational angle transmission mechanism 129 and are arranged in parallel to each other and a conveyance finger 121 for holding the work. The base end of the link 130 is fixed to the drive shaft 123 provided concentrically with the drive axis 23 to which the base end of the link 30 as the drive side link of the conveyance arm 20. The base end of the link 131 arranged in parallel to the link 130 is fixed rotatable to the joint axis P10 provided on the base plate 122 via the ball bearing 47. Besides, at the tip end of the link 130, the rotary shaft 139 as the joint axis P12 is supported rotatable via the ball bearing 48, and on this rotary shaft 139, the rotational angle transmission mechanism 129 is supported rotatable via the bail bearing 48. Here, each rotary shaft 39, 139 has such a shape as to be used in common with the rotational angle transmission mechanisms 29, 129. The tip end of the link 131 is fixed rotatable via the ball bearing 47 to the joint axis P11 provided in the rotational angle transmission mechanism 129.

The joint axis P10 is arranged at the position away from the drive axes 23, 123 by the same distance as the distance away from the joint axis P1, on the extension in the linear moving direction (direction T) of the conveyance fingers 21, 121 that connects the drive axes 23, 123 and the rotational center axis of the joint axis P1 on the base plate 122. As such, the short link axis 23 of the first parallel link mechanism 36 that connects the drive axes 23, 123 and the rotational center axis of the joint axis P1 and the short link axis 67 of the first parallel link mechanism 136 that connects the drive axes 23, 123 and the rotational center axis of the joint axis P10 have the same lengths and are arranged on the same straight line. Besides, the joint axis P11 is arranged on the rotational angle transmission mechanism 129 in such a manner that the positional relation of the joint axis P11 relative to the joint axis on the rotational angle transmission mechanism 129 is the same as the joint axis P10 relative to the drive axis 123. As such, the short link axis 67 and the short link axis 34 arranged on the base plate 122 and the short link axis 68 that connects the rotational center axis of the joint axis P11 and the joint axis P12 on the rotational angle transmission mechanism 129 have the same lengths, and rotation applied from a rotational drive source such as motor 146 e.g. to the drive axis 123 via the link 130 is transmitted to the link 131, the links 130, 131 rotate by the same angles and the short link axis 68 and the rotational angle transmission mechanism 129 move back and forth while they are kept in parallel to the short link axes 67, 34.

The link 132 as the drive side link of the second parallel link mechanism 138 has a base end mounted on the top of the rotary shaft 139 as the joint axis P12 with a bolt and a tip end mounted rotatable on the joint axis P14 arranged on the conveyance finger 121. The link 133 as a driven side link arranged in parallel to the link 132 has a base end mounted rotatable on the joint axis P13 arranged on the rotational angle transmission mechanism 129 and a tip end rotatable on the joint axis P15 arranged on the conveyance finger 121. The short link axis 69 that connects the joint axis P12 and the joint axis P13 and the short link axis 70 that connects the joint axis P14 and the joint axis P15, shown in the plan view, are in parallel to each other and have the same lengths. As such, when a rotational force about the joint axis P12 as a rotation center is applied from the outside to the link 132 as a drive side link, the link 132 rotates about the joint axis P12 as a rotation center and the link 133 as a driven side link rotates by the same angle in conjunction with rotation of the link 132. The short link axis 70 that connects both tip ends of the links 132, 133 moves back and forth while the short link axis 70 is kept in parallel to the short link axis 69.

Transmission to the link 132 of rotational movement transmitted via the drive shaft 123 to the link 130 is performed by the same mechanism as the rotational angle transmission mechanism 29 provided in the above-described first conveyance robot. At the bottom of the rotary shaft 139 (joint axis P12) to which the base end of the link 132 is fixed, a base end of the link lever 141 is fixed thereto. At the position a distance R away from the rotational center axis of the joint axis P12 (rotary shaft 139) on the link 130, the joint axis P16 is arranged, and likewise, at the position a distance R away from the rotational center axis of the joint axis P12 (rotary shaft 139) on the link lever 141 joint axis P17 is arranged. As such, the joint axis P16 and the joint axis P17 are, as seen from above, symmetric with respect to the like connecting the center axes of the joint axes P11, P12, P13, like in the conveyance arm 20 and an end of the first link rod 142 as a drive side link rod is mounted rotatable on the axis P16 and an end of the second link rod 143 as a driven side link rod is mounted rotatable on the joint axis P17. The other ends of the link rods 142, 143 are mounted rotatable via the ball bearings 47 on the joint axes P18, P19 arranged on the slider 45 arranged slidable along the slide guide 44 as liner guiding means in parallel to the short link axes 68, 69 at the lower surface side of the link base 140. With this structure, like in the conveyance arm 20, in the conveyance arm 120, rotation applied to the link 130 is transmitted to the link 132, thereby allowing the conveyance finger 121 to move back and force in parallel to the center line.

Figure 1:
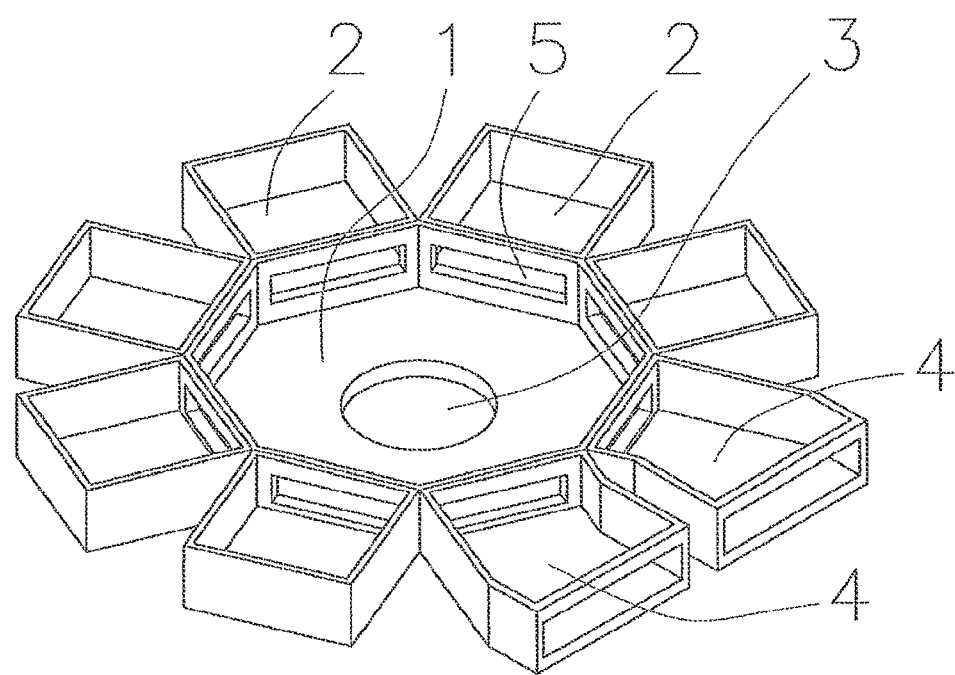
FIG. 1 is a perspective view illustrating an example of a transfer chamber and processing chambers.
Figure 2A:
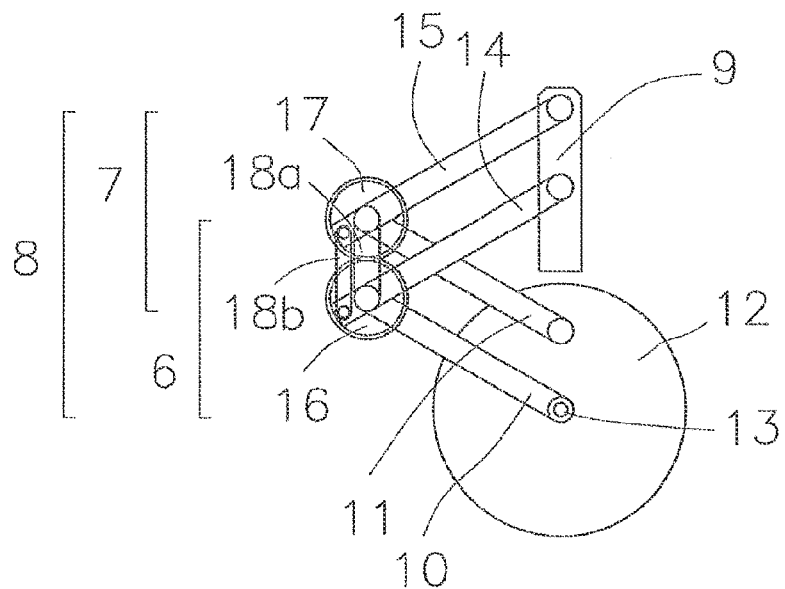
FIG. 2A is a plan view schematically illustrating an example of a conventional conveyance robot.
Figure 2B:
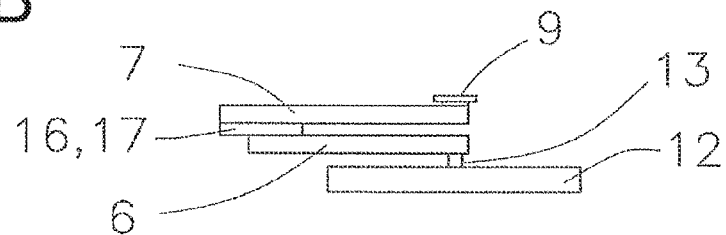
FIG. 2B is a lateral view schematically illustrating an example of the conventional conveyance robot.
Figure 2C:
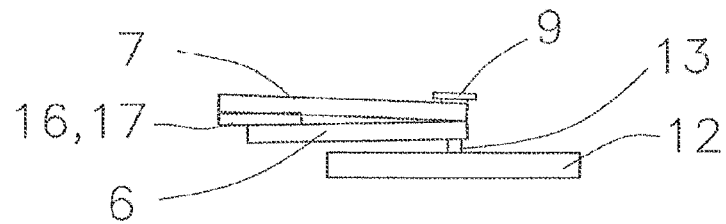
FIG. 2C is a lateral view illustrating worn bearing and gear of the conveyance robot shown in FIG. 2B.
Figure 3:
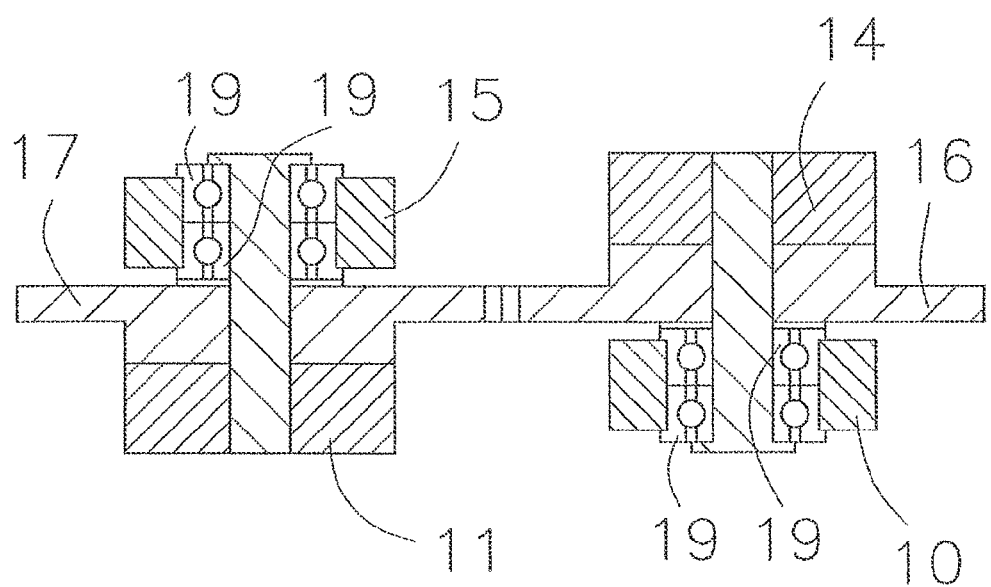
FIG. 3 is a cross sectional view illustrating the structure around the gears provided in the conventional conveyance robot.

The vertical positional relations of the conveyance arms 20 and 120 are such that they are arranged at the vertically different heights so as to prevent interference of respective arms in reciprocating motion as shown in the front view of FIG. 1b. Besides, in order to minimum a vertical space between the conveyance fingers 21, 121, the conveyance finger 21 is arrange on the upper part of the second parallel link mechanism 38 and the conveyance finger 121 is arranged at the lower part of the second parallel link mechanism 138. With this structure, when a work placed on the table is replaced with a work on the conveyance finger, the moving distance in the vertical direction by the drive source (not shown) can be shortened.

The motors 46, 146 as drive sources are provided at the lower part of the base plate 122 and the drive forces of motors 46, 146 is transmitted to the conveyance arm 20 and conveyance arm 120 by the drive axis 23, 12. The drive axes 23, 123 are supported concentrically and independently rotatable by the base plate 122 at the center or the base plate 122. At the base ends of the drive axes 23, 123, pulleys of the same diameters are fixed thereto, and are connected to pulleys fixed to the rotational axes of the motors 46, 116 via belts. With this structure, rotation of the motor is transmitted as motion of the link mechanism of the conveyance arm 20, and rotation of the motor 146 is transmitted as motion of the link mechanism of the conveyance arm 120.

Figure 14:
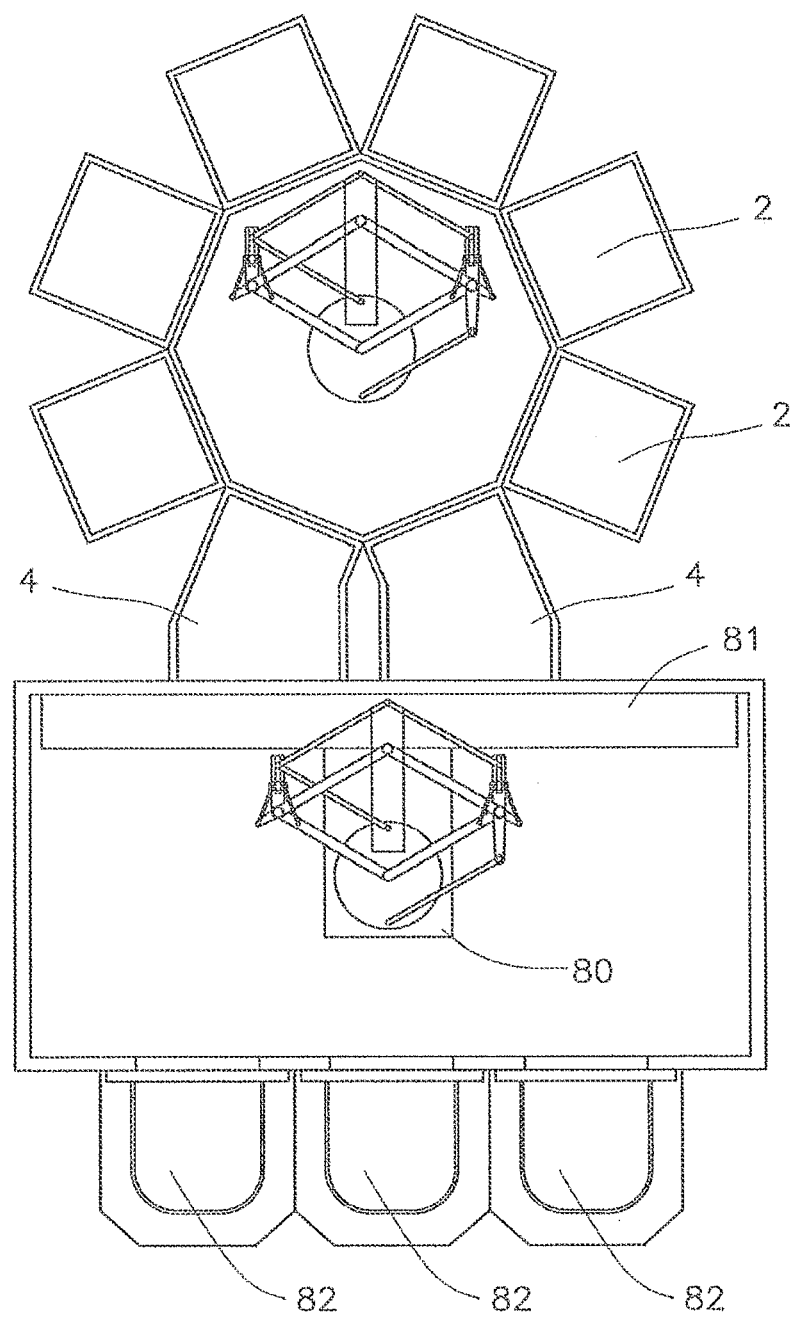
FIG. 14 is a plan view illustrating an example of a device in which the conveyance robot according to the present invention is installed.

Further, as not shown, the above-described second conveyance robot is provided with lifting means for listing the second conveyance robot as a whole up and down and turning means for turning the second conveyance robot in the horizontal plane. With this structure, as illustrated in FIG. 14, the second conveyance robot installed approximately at the center of the transfer chamber 1 is used to be able to transfer works to work tables (not shown) provided in the processing chambers 2 and load lock chambers 4 radially arranged in the horizontal plane from the turn center axis of the second conveyance robot. Further, the second conveyance robot provided with the lifting means and turning means is placed on a table 80 and horizontal moving means 81 capable moving the table linearly in the horizontal plane is provided thereby to convey works placed on delivery tables 82, arranged in parallel to the moving direction of the horizontal moving means 81 between the delivery tables 82 and the load lock chambers 4.

Further, if a drive motor part under the base plate 122 has a known sealed structure such as partition walls or bellows, the conveyance robot of this embodiment can be placed in the transfer chamber 1, instead of the conventional conveyance robot 1, and finished works 23 placed in the processing chambers 22 provided at any positions around the transfer chamber 1 can be replaced with unprocessed works 24. Furthermore, as the conveyance fingers 21, 121 at the standby position are placed back relative to the turn center axis of the second conveyance robot in the moving direction, the entire length of the conveyance finger can be elongated in the moving direction as compared with the conveyance finger 21 illustrated in the embodiment and as such, it is possible to access works further away as compared with the conventional conveyance robot 1 having the same turn radius.

In the above-described first and second conveyance robots, the inside of the transfer chamber 1 in which the conveyance robot is places is kept in the vacuum or reduced pressure atmosphere, and it is necessary to isolate the inside the transfer chamber 1 from the outside when each drive source is accommodated. Therefore, in the above-described embodiment, the air-tightness of the transfer chamber 1 from the external environment is maintained by use of bellows or magnetic fluid in a bearing part of the drive axis 23. However, air-tight partition walls for isolating the transfer chamber 1 from the drive source may be provided and magnet couplings for transmitting a drive force generated from each drive source by magnetic coupling may be provided on the other side of the partition walls, or a direct drive motor may be provided for rotating a rotor arranged on the opposite sides of the partition walls by a magnetic field (generated by a stator.

Next description is made about a conveyance robot according to a third embodiment of the present invention, using a drive motor (hereinafter referred to as "third conveyance robot").

Figure 9A:
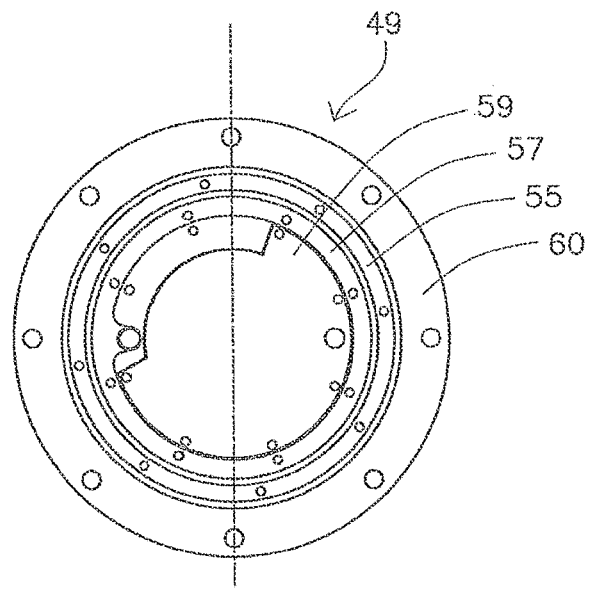
FIG. 9A is a plan view illustrating a drive unit as a drive source for operating each link of a conveyance robot according to a third embodiment of the present invention (third conveyance robot)
Figure 9B:
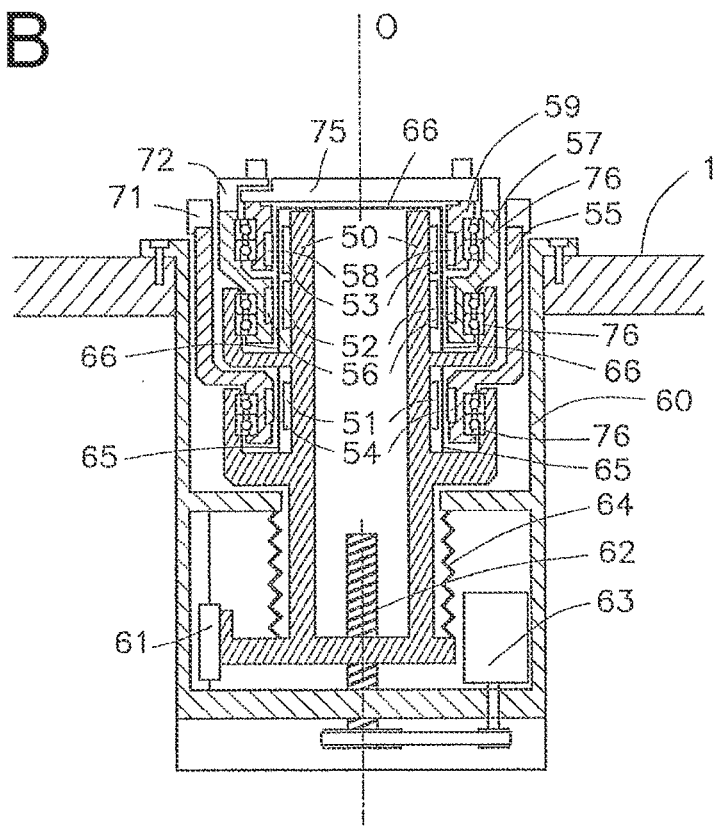
FIG. 9B is a cross sectional view illustrating the inner structure of the drive unit of the third conveyance robot.

FIG. 9A is a plan view of a drive unit 49 as a drive source for operating each link of the conveyance robot (third conveyance robot) according to the third embodiment of the present invention, and FIG. 9B is a cross sectional view illustrating its inner structure. Each member of the drive unit 49 is provided in a cylindrical housing 60. The upper end of the housing 60 has a flange shape. A round opening 3 for setting the drive unit 49 is formed at the bottom wall of the transfer. The housing 60 is inserted into the opening 3 from the above of the transfer chamber 1 and fixed to the bottom wall of the transfer chamber 1 in an airtight manner. Inside the housing, an approximately cylindrical support shaft 50 is mounted liftable on the housing 60 via a slide guide 61. The bottom of the support shaft 50 is engaged with a ball screw nut of a ball screw 62 supported rotatable at the bottom of the housing 60. At the lower end of the ball screw 62, a pulley is fixed thereto, which is connected via a belt to the pulley fixed to the rotational axis of the lifting motor 63 provided at the bottom of the housing 60. With this structure, rotation of the lifting motor is transmitted to the ball screw 62 is each pulley and belt thereby to be able to lift the support shaft 50 up and down. Here, in a gap between the support shaft 50 and the housing 60, a bellows 64 is mounted in an airtight manner, and the atmosphere inside the transfer chamber 1 is isolated from the external atmosphere even when the support shaft 50 is lifted up or down.

At the outer wall, surface of the support shaft 50, a first stator 51, a second stator 52 and a third stator 53 as stators of the respective direct drive motors are provided to surround the support shaft 50 in a concentric manner with the support shaft 50 and as vertically displaced from each other. At the positions facing the stators 51, 52, 53 at the opposite sides of the partition walls 65, 66, drive bosses that have rotators as permanent magnets and are rotated by magnetic forces generated by respective stators are arranged rotatably, concentrically with the support shaft 50 and vertically displaced from each other. At the position of the outer periphery of the first stator 51 arranged at the lowest position among the stators, on the opposite side of the cylindrical partition wall 65, the first drive boss 55 is mounted rotatable via a ball hearing 76 as a hearing member at the jutting part of the support shaft 50. The first drive boss 55 has a bowl-shaped cross section and at the position facing the first stator 51, a first rotor 54 composed of permanent magnets as a rotator of the direct drive motor is fixed to cover the inner surface periphery of the first drive boss 55. Here, the top of the first drive boss 55 juts in the transfer chamber 1 up to the position higher than the top of the housing 60. With rotation of the first drive boss 55, the member arranged in the transfer chamber 1 can be operated.

Likewise, at the position of the outer periphery of the second stator 52 arranged at the vertically intermediate position among the stators, on the opposite side of the cylindrical partition wall 66 with the top surface closed, the second drive boss 57 is mounted rotatable on the support shaft 50 via the ball bearing 76. The second drive boss 57 also has a bowl-shaped cross section like the first drive boss 55, and at the position facing the second stator 52, a second rotor 56 is fixed to cover the inner surface periphery of the second drive boss 57. The top of the second drive boss 57 juts in the transfer chamber 1 up to the position higher than the top of the first drive boss 55. At the position of the outer periphery of the third stator 53 arranged at the highest position among the stators, on the opposite side of the partition wall 66, the third drive boss 59 is mounted rotatable on the second drive boss 57 via the ball bearing 76. The third drive boss 59 is cylindrical, and at the position facing the third stator 53, a third rotor 58 is fixed to cover the inner surface periphery of the third drive boss 59. Besides, the top of the third drive boss 59 juts in the transfer chamber 1 up to the position higher than the top of the second drive boss 57. As described above, the first to third direct drive motors and drive bosses are arranged concentrically and vertically shifted from each other.

Each stator fixed to the outer periphery of the support shaft 50 is composed of winding and the tip end of this winding passes from the cavity part of the approximately tubular support shaft 50 through a wiring hole formed in the bottom wall of the support shaft 50 and is connected to a controller (not shown) provided outside the drive unit 49. Here, the electric components and wiring members are likely to emit outgas and scatter dust in vacuum or reduced pressure atmosphere, and it is necessary to isolate the air space where the electric components and wiring members are placed from the vacuum or reduced pressure atmosphere of the inside of the transfer chamber 1 where the rotors and drive bosses are placed. Then, at the outer circumference of the first stator 51, the partition wall 65 is provided to isolate the space around the first stator 51 from the other space in an airtight manner, and the hat-shaped partition wall 66 is provided to isolate the space around the top of the support shaft 50 and the outer circumferences of the second stator 52 and the third stator 53 from the other space in an airtight manner. With this structure, in combination with the above-mentioned bellows 64, it is possible to isolate the air space from the vacuum or reduced pressure atmosphere inside the transfer chamber 1.

The first stator 51, the second stator 52 and the third stator 53 are electrically connected to a controller (not shown), and with use of electric signals from this controller, the first stator 51 rotates the first drive boss 55, the second stator 52 rotates the second drive boss 57 and the third stator 53 rotates the third drive boss 59 respectively and each stator 51, 52, 53 rotates drive bosses 55, 57, 59 in any rotational directions independently. Here, each direct drive motor is provided with a rotational position detector in the resolver system (not shown) as the rotational position detecting means, and this controller also detects the position moved by a rotation in a rotational direction and the original position of each rotor. Besides, as illustrated in FIG. 9A, out of the drive bosses, the third drive boss 59 of the smallest diameter is arranged at the innermost part, and secondly, the second drive boss 57 and lastly, the first drive boss 55 are arranged concentrically as seen from the above.

Figure 10:
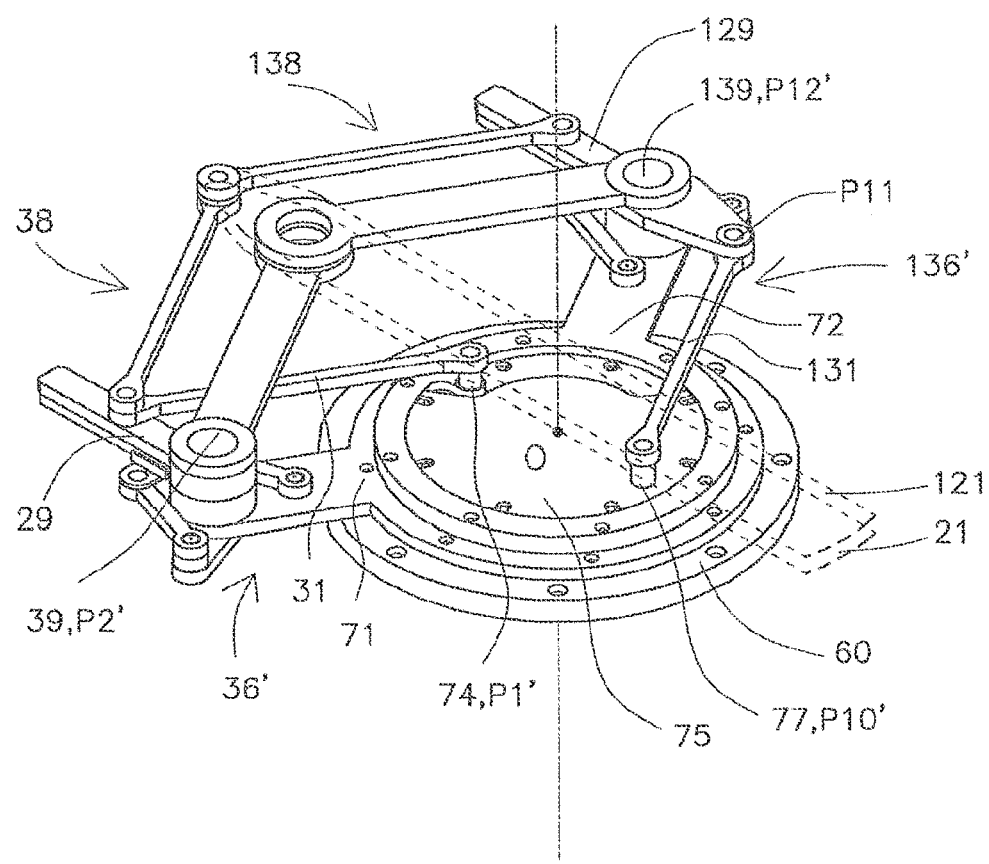
FIG. 10 is a perspective view illustrating the third conveyance robot of the present invention.

Next description is made, with reference to figures, about the parallel link mechanisms of the third conveyance robot provided with the drive unit 49 described above. FIG. 10 is a perspective view illustrating parallel link mechanisms and arms provided in the third conveyance robot. The first link arm 71 has a circular ring part that has a diameter corresponding to the first drive boss 55 and an arm part extending radially from this circular ring part. The circular ring part and the arm part are formed integrally. The circular ring part of this first link arm 71 is fixed to the top surface of the first drive boss 55 provided in the drive unit 49 in a concentric manner with the rotational center axis O of the first drive boss 55, and with rotation of the first drive boss 55, the first link arm 71 also rotates about the rotational center axis O. At the tip end of this arm part, the rotary shaft 39 is supported rotatably via the ball bearing 48 and at this rotary shaft 39, the rotational angle transmission mechanism 29 which is the same as that in the above-described second conveyance robot is supported rotatably via the ball bearing 48. This rotary shaft 39 serves as the joint axis P2' that is equivalent to the joint axis P2 of the above-described second conveyance robot.

Likewise, the second link arm 72 has a circular ring part that has a diameter corresponding to the second drive boss 57 and an arm part extending radially from this circular ring part. The circular ring part and the arm part are formed integrally. The circular ring part of this second link arm 72 is fixed to the top surface of the second drive boss 57 provided in the drive unit 49 in a concentric manner with the rotational center axis of the second drive boss 57, and with rotation of the second drive boss 57, the second link arm 72 also rotates about the rotational center axis O. At the tip end of this arm part, the rotary shaft 139 is supported rotatably via the ball bearing 48 and at this rotary shaft 139, the rotational angle transmission mechanism 129 which is the same as that in the above-described second conveyance robot is supported rotatably via the ball bearing 48. This rotary shaft 139 serves as the joint axis P12' that is equivalent, to the joint axis P12 of the above-described second conveyance robot. Besides, as described above, as the first drive boss 55 and the second drive boss 57 are arranged concentrically, the rotational center axis O of the circular ring parts of the first and second link arms 71, 72 are common and the positions of the joint axes P2' and P12' are located on the concentric circle with the rotational center axis O as a center as seen from above. Further, the first and second link arms 71, 72 are arranged at positions vertically displaced from each other in order to prevent interference of mutual rotations.

In addition, the internal diameter side of the circular ring part of the second link arm 72 juts from the circular ring part in the direction of the rotational center axis. This is for fixing the column support 74 for rotatably supporting the base end of the link 31 arranged in parallel to the straight line that connects the rotational center axis of the rotary shaft 39 and the rotational center axis O of the circular ring part of the first link arm 71. Here, the base end of this link 31 that is rotatable mounted serves as the joint axis P1'. In this link 31, the same member used in the above-described second conveyance robot is used. The tip end of this link 31 is mounted rotatable on the joint axis P3 arranged on the rotational angle transmission mechanism 29.

At the top of the third drive boss 59, a disk-shaped top plate 75 is fixed. The disk-shaped top plate 75 has outer diameter-dimensions smaller than the inner diameter-dimensions of the circular ring part of the second link arm 72. The top plate 75 also rotates in accordance with rotation of the third drive boss 59. In the upper surface of the top plate 75, a notch is formed in a shape that the top plate 75 can avoid moving area of the overhanging part so as to prevent interference with the overhanging part for fixing the column support 74 formed in the circular ring part of the second link arm 72 described above. Further, at the upper part of the top plate 75, a column support 77 is provided for rotatably supporting the base end of the link 131 arranged in parallel to the straight line that connects the rotational center axis of the rotary shaft 139 and the rotational center axis O of the circular ring part of the second link arm 72. In this link 131, the some member used in the second conveyance robot described above is used. The base end of this link 131 rotatably mounted is the joint axis P10'. The tip end of the link 131 of which the base end is rotatably supported by the column support 77 is rotatably mounted via the ball bearing 47 on the joint axis P11 arranged on the rotational angle transmission mechanism 129 supported by the second link arm 72.

Here, each of drive bosses 55, 57, 59 and the first link arm 71 and the second link arm 72 has a common rotational center axis O. The center axes of respective joint axes P1', P10' are arranged concentrically with the rotational center axis O seen from above as a center and thus the joint axes P1', P10' move around the rotational center axis O above as a center. When the first drive boss 55, the second drive boss 57 and the third drive boss 59 are located on the original positions, the center axes of the joint axes P1', P10' and the rotational center axis O are arranged on the straight line in parallel to the moving direction of conveyance finger seen from above. At this time, the line that connects the rotational center axis O and the joint axis P1' arranged on the second link 72 is the short link axis 34' and the line that connects the rotational center axis O and the joint axis P10' arranged on the top plate 75 is the short link axis 67'

Further, as the distance from the rotational center axis O to the joint axes P2', P12' is the same as the distance from the rotational center axis of the drive axes 23, 123 in the second conveyance robot to the joint axes P2, P12, the link mechanism of the third conveyance robot becomes the same as that of the second conveyance robot. That is, the long link 30' that connects the rotational center axis O and the center axis of the joint axis P2' and the long link 31 that connects the center axes of the joint axis P3 and the joint axis P1' are arranged in parallel to each other, and the short link axis 34' that connects the rotational center axis O and the center axis of the joint axis P1' and the short link axis 35' that connects the center axes of the joint axis P3 and the joint axis P2' are also arranged in parallel to each other. As a result, those links 30', 31, 34' and 35' form the first parallel link mechanism 36 as the drive side link mechanism. Likewise, the long link 130' that connects the rotational center axis O and the center axis of the joint axis P12' and the long link 131' that connects the center axes of the joint axis P11 and the joint axis P10' are arranged in parallel to each other, and the short link axis 67' that connects the rotational center axis O and the center axis of the joint axis P10' and the short link axis 68' that connects the center axes of the joint axis P11 and the joint axis P12' are also arranged in parallel to each other. As a result, those links 67', 68', 130' and 131' form the first parallel link mechanism 136' as the drive side link mechanism.

As to the structure other than the above-described structure of each arm, the same mechanism as the above-described second conveyance robot is provided. Rotation applied to the first parallel link mechanism 36' is transmitted to the second parallel link mechanism 38 by the rotational angle transmission mechanism 29 provided at the tip end of the link 31 and the first link arm 71, and rotation applied to the first parallel link mechanism 136' is transmitted to the second parallel link mechanism 136' by the rotational angle transmission mechanism 129 provided at the tip end of the link 131 and the second link arm 72.

Figure 11A:
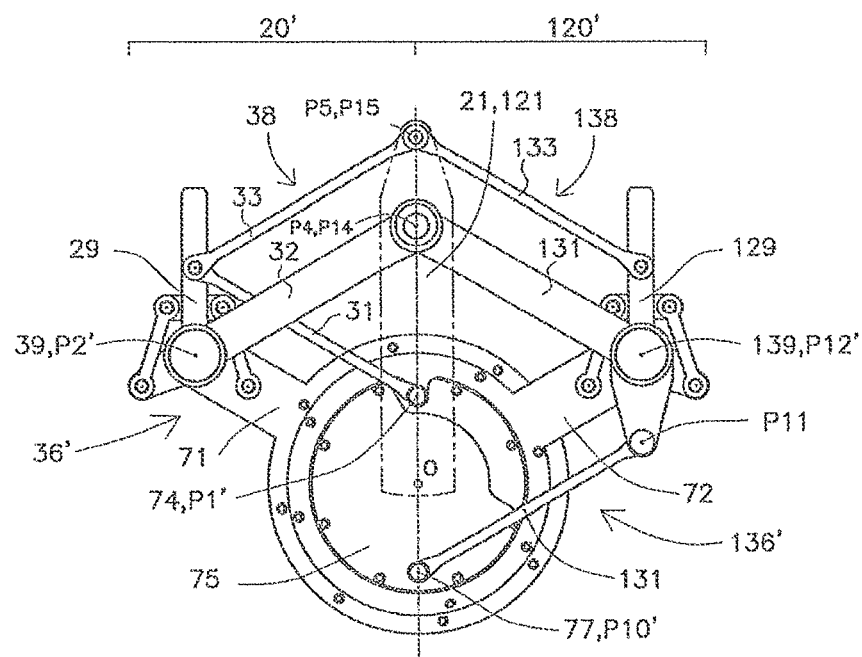
FIG. 11A is a plan view of the third conveyance robot, of which each drive boss is at the original position.
Figure 11B:
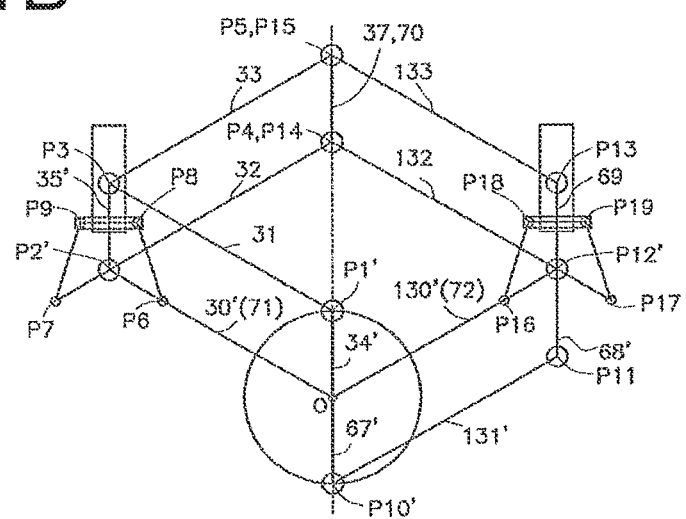
FIG. 11B is a plan view schematically illustrating the positional relation between rotational angle transmission mechanisms and joint axes and link arms of the third conveyance robot.
Figure 12A:
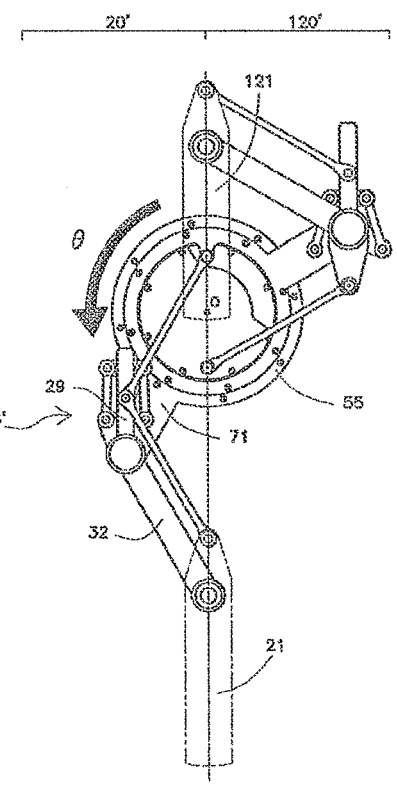
FIG. 12A is a plan view illustrating the third conveyance robot of which only the first link arm as drive side link of the first parallel link mechanism which is rotated by the angle θ in the CCW direction (counterclockwise direction) from the original position shown in FIG. 11A by the first drive boss.
Figure 12B:
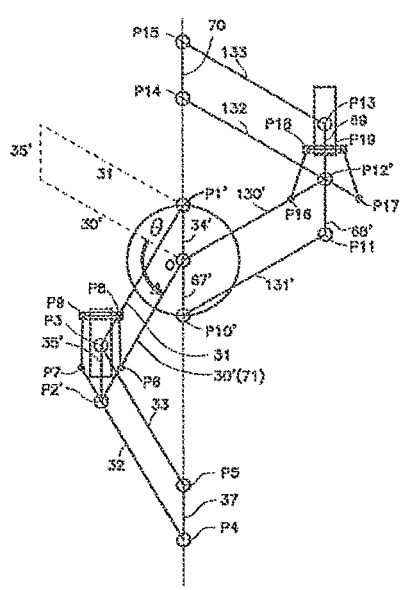
FIG. 12B is a plan view schematically illustrating the link mechanism of FIG. 12A.

Next description is made, with reference to FIGS. 11A, 11B, 12A, 12B, 13A and 13B, about the operation of each arm of the third conveyance robot. FIG. 11A is a plan view illustrating the operation when each drive boss of the third conveyance robot is at the original position. FIG. 11B schematically illustrates the positional relation of each rotational angle transmission mechanism and each joint axis and each link arm. With the arm attitude when each drive boss illustrated in FIG. 10 is at the original position, the turn radius of the third conveyance robot becomes minimum.

When the first link arm 71 as the drive side link of the first parallel link mechanism 36' is only rotated in the CCW direction (counterclockwise direction) by the angle θ from the original position (illustrated in FIG. 11A) by the first drive boss 55, the first parallel link mechanism 36' rotates in the CCW direction by the angle θ and the short link axis 35' moves forward in the direction T while it is kept in parallel to the short link axis 34'. In conjunction with this, rotation applied to the first link arm in the CCW direction by the angle θ is applied to the link 32 as the drive side link of the second parallel link mechanism 38 via the rotational angle transmission mechanism 29 as the rotation in the CW direction (clockwise direction) opposite to the direction of the rotation applied to the first link arm 71. The second parallel link mechanism 38 to which the rotational force is transmitted rotates in the CW direction (clockwise direction) by the angle θ applied to the first parallel link mechanism 36'. With this series of operations, the conveyance finger 21 moves forward in the direction T in parallel to the short link axis 34' (see FIGS. 12A and 12B). As the first link arm 71 is rotated in the CW direction from the attitude shown in FIG. 12A to the original position, each parallel link mechanism operates in the direction opposite to the direction of the above-described operation and the conveyance finger 21 moves back to the original position.

Figure 13A:
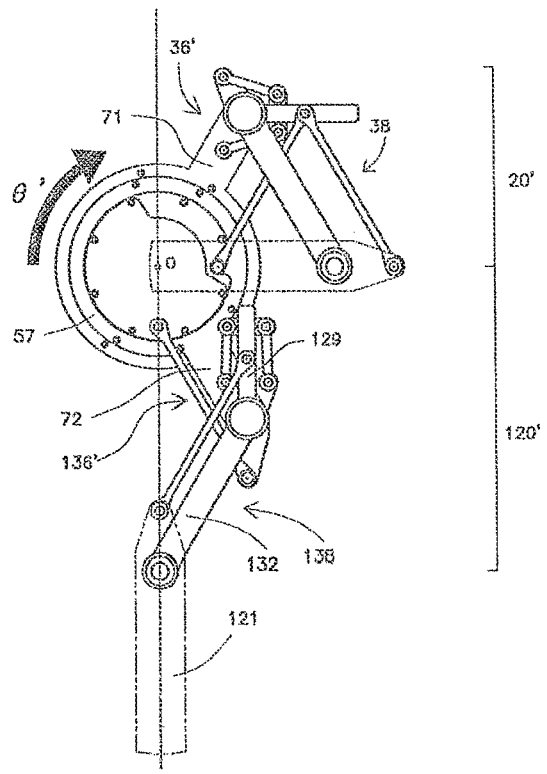
FIG. 13A is a plan view illustrating the operation of the conveyance robot according to the third embodiment of the present invention.
Figure 13B:
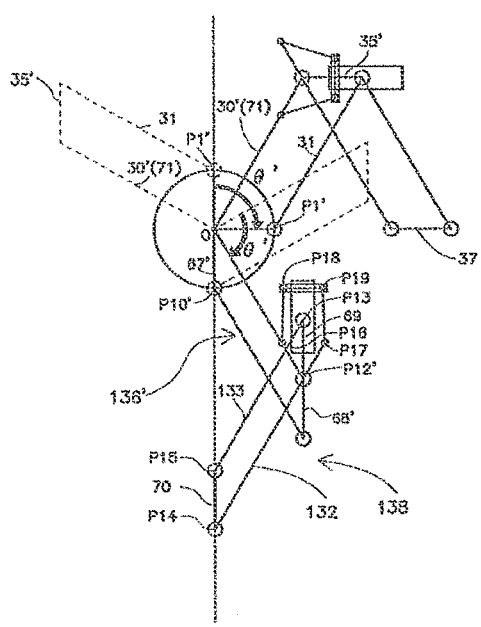
FIG. 13B is a plan view schematically illustrating the link mechanism of FIG. 13A.

Next description is made, with reference to FIGS. 13A and 13B, about the method of moving the conveyance a finger 121 forward from the original position in FIG. 11A. In order to move the conveyance finger 121 forward from the original position illustrated in FIG. 11A, first, the second drive boss 57 is operated and the second link arm 72 as the drive side link of the first parallel link mechanism 136 is rotated by the θ' in the CW direction so that the first parallel link mechanism 136' rotates in the CW direction by the angle θ' and the short link axis 68' also moves forward while it is kept in parallel in the direction T. In conjunct with this, rotation by the angle θ' in the CW direction applied to the second link arm 72 is transmitted to the link 132 as the drive side link of the second parallel link mechanism 138 via the rotational angle transmission mechanism 129 as rotation in the COW direction (counterclockwise direction) opposite to the rotational direction applied to the second link arm 72.

The second parallel link mechanism 138 to which the rotational force is transmitted rotates in the COW direction (clockwise direction) by the angle θ' applied to the first parallel link mechanism 136'. With this series of operations, the conveyance finger 121 moves forward in the direction T. At this time, rotation of the second link arm 72 to which the rotational force is applied is also applied to the link 31 rotatably mounted on the joint axis P1 of which the base end is arranged at the circular ring part of the second link arm 72. Therefore, the first link arm 71 needs to operate in the CW direction by the angle θ simultaneously when the second link arm 72 rotates. With this structure, the first parallel link mechanism 36' and the second parallel link mechanism 38 rotate in the CW direction by the angle θ' around the turn center axis O while their positional relation shown in FIG. 10 is maintained. At this time, the first parallel link mechanism 36' and the second parallel link mechanism 38 rotate with the minimum turn radius of the third conveyance robot, and if the third conveyance robot is installed in the transfer chamber 1, it is not in contact with the wall surface of the transfer chamber 1.

Further, as the first drive boss 55, the second drive boss 57 and the third drive boss 59 rotate together in the same direction, the third conveyance robot can turn around the rotational center axis O.

Further, instead of using in the vacuum and reduced-pressure atmosphere, the third conveyance robot described above can be also used well in the air atmosphere or inert gas atmosphere, like the first conveyance robot and the second conveyance robot in the different embodiments. In such a case, there is no need to provide partition walls 65, 66 that isolate the inside of the transfer chamber 1 from the external atmosphere.

REFERENCE NUMERALS 1 transfer chamber
2 processing chamber 3 opening
4 load lock chamber
5 gate
6, 36, 136 first parallel link mechanism
7, 38, 138 second parallel link, mechanism.
8, 20, 120 conveyance arm
9 conveyance table
12 base table
13, 23 drive axis
16, 17 gear
18a, 18b short link
19 bearing
21 conveyance finger
22 base plate
24 work
29 rotational angle transmission mechanism
34, 35, 37, 67-69 short link short link axis
39 rotary shaft
40 link base
41 link lever
42 first link rod
43 second link rod
44 slide guide
45 slider
46 motor
49 drive unit
50 support shaft
60 housing
62 ball screw
63 lifting motor
65, 66 partition wall
P1 to P19 joint axis

The invention claimed is:

1. A conveyance arm comprising:
a first parallel link mechanism having a first drive side link with an end connected to a drive axis and first driven side link arranged in parallel to the first drive side link;
a second parallel link mechanism having a second drive side link with an end connected to an opposite end of the first drive side link via a rotational axis rotatably and a second driven side link with an end connected to an opposite end of the first driven side link via a rotational axis rotatably, the second driven side link being arranged in parallel to the second drive side link;
a short link connecting ends of the links of the first parallel link mechanism and the second parallel link mechanism rotatably; and
a rotational angle transmission mechanism having a linear conversion link mechanism for converting rotation applied to the first drive side link into linear movement along the short link and a rotation conversion link mechanism for converting the linear movement into rotation to rotate the second drive side link in an opposite direction by an angle equal to a rotational angle of the first drive side link,
wherein rotation applied to the first drive side link of the first parallel link mechanism causes an opposite end of the second parallel link mechanism to move back and forth,
the rotational angle transmission mechanism has a first link rod with an end mounted on a predetermined position of the first drive side link rotatably, a second link rod with an end mounted rotatably on a position extended in a direction of a tip end of the second drive side link of the second parallel link mechanism in a horizontal plane, and a guide means to which opposite ends of the first and second link rods are mounted rotatably, the guide means for guiding the opposite ends of the first and second link rods in a linear direction,
the positions on which the first and the second link rods are mounted are symmetrical with respect to the short link in common, and
rotation applied to the first drive side link of the first parallel link mechanism causes the one end of the second link rod to follow a circular track which is symmetrical with a circular track drawn by the one end of the first link rod with respect to the short link.

2. The conveyance arm of claim 1, wherein the rotational angle transmission mechanism is rotatably held at a tip end of the first drive side link, and a tip end of the first driven side link of the first parallel link mechanism and a base end of the second driven side link of the second parallel link mechanism are mounted rotatably on a joint axis arranged on an upper surface of the rotational angle transmission mechanism, concentrically and vertically shifted from each other.

3. A conveyance robot comprising a conveyance arm of claim 1.

4. A conveyance robot, comprising first and second conveyance arms, wherein;
each of the first and the second conveyance arms consists of the conveyance arm of claim 1,
each of the first drive side links of the first and the second conveyance arms has a circular ring part and an arm part extending radially from the circular ring part,
the circular ring parts of the first and the second conveyance arms are concentrically and vertically shifted each other and are independently rotatable,
a first rotational angle transmission mechanism as the rotational angle transmission mechanism of the first conveyance arm is supported pivotably to a tip end of the first drive side link of the first conveyance arm,
a second rotational angle transmission mechanism as the rotational angle transmission mechanism of the second conveyance arm is supported pivotably to a tip end of the first drive side link of the second conveyance arm,
the first driven side link of the first conveyance arm is arranged in parallel to a straight line connecting a rotational center of the circular ring parts to a rotational center of the first rotational angle transmission mechanism while the first driven side link of the second conveyance arm is arranged in parallel to a straight line connecting the rotational center of the circular ring parts to a rotational center of the second rotational angle transmission mechanism,
a base end of the first driven side link of either one of the first and second conveyance arms is supported pivotably to the circular ring part of the other conveyance arm that has the first driven side link with a base end pivotably supported on a top plate, and
the top plate is rotated concentrically with the circular ring parts by a third drive source other than drive sources for rotating the circular ring parts of the first and the second conveyance arms.

* * * * *